United States Patent [19]
Kwon et al.

[11] Patent Number: 5,659,510
[45] Date of Patent: Aug. 19, 1997

[54] INTEGRATED CIRCUIT DEVICES WITH RELIABLE FUSE-BASED MODE SELECTION CAPABILITY AND METHODS OF OPERATING SAME

[75] Inventors: Kook-Hwan Kwon; Hee-Choul Park, both of Kyungki-do, Rep. of Korea

[73] Assignee: Samsung Electronics Co., Ltd., Suwon, Rep. of Korea

[21] Appl. No.: 651,374

[22] Filed: May 22, 1996

[30] Foreign Application Priority Data

May 25, 1995 [KR] Rep. of Korea ............... 95-13272

[51] Int. Cl.[6] .................. G11C 7/00; G11C 17/00
[52] U.S. Cl. ............... 365/200; 365/96; 365/225.7
[58] Field of Search ..................... 365/200, 206, 365/225.7, 96

[56] References Cited

U.S. PATENT DOCUMENTS

| | | | |
|---|---|---|---|
| 4,441,170 | 4/1984 | Folmsbee et al. | 365/200 |
| 4,485,459 | 11/1984 | Venkateswaran | 365/200 |
| 4,573,146 | 2/1986 | Graham et al. | 365/200 |
| 4,639,895 | 1/1987 | Iwahashi et al. | 365/200 |
| 4,791,319 | 12/1988 | Tagami et al. | 365/200 |
| 4,996,672 | 2/1991 | Kim | 365/225.7 |
| 5,239,511 | 8/1993 | Oh | 365/225.7 |
| 5,311,472 | 5/1994 | Ota | 365/200 |
| 5,325,334 | 6/1994 | Roh et al. | 365/200 |
| 5,337,278 | 8/1994 | Cho | 365/200 |
| 5,394,368 | 2/1995 | Miyamoto | 365/200 |
| 5,422,580 | 6/1995 | Sukegawa et al. | 365/200 |
| 5,465,234 | 11/1995 | Hannai | 365/200 |
| 5,469,388 | 11/1995 | Park | 365/200 |
| 5,528,539 | 6/1996 | Ong et al. | 365/200 |
| 5,568,444 | 10/1996 | Johnson et al. | 365/200 |
| 5,570,318 | 10/1996 | Ogawa | 365/200 |

*Primary Examiner*—David C. Nelms
*Assistant Examiner*—Trong Quang Phan
*Attorney, Agent, or Firm*—Bell, Seltzer, Park & Gibson

[57] ABSTRACT

Integrated circuit chips with fuse-based mode selection capability include a first signal generator for storing a first logic state when the fuse is blown, in response to an externally generated input signal, and for generating a first option changing signal based on the stored first logic state. To reduce the susceptibility to noise and inadvertent designation signals, a second signal generator for storing a second logic state when the fuse is blown is also provided and that fuse is blown in response another externally generated input signal. However, rather than blowing the fuses of the first option changing signal generator and the second option changing signal generator by applying external input signals simultaneously, the fuses are blown sequentially by connecting the second option changing signal generator in series with the first option changing signal generator so that the second option changing signal cannot be generated unless the first option changing signal generator has already been generated. To further lessen the likelihood of inadvertently blowing a fuse, thereby causing a reduction in yield of an integrated circuit semiconductor device, the first option changing signal generator is also connected in series with a dummy option changing signal generator. This dummy option changing signal generator is used to prevent the inadvertent generation of the first logic state caused by a blown fuse in the first option changing signal generator. The first and second option changing signals are then provided to a functional circuit to designate an active mode.

7 Claims, 5 Drawing Sheets

INTEGRATED CIRCUIT DEVICES WITH RELIABLE FUSE-BASED MODE SELECTION CAPABILITY AND METHODS OF OPERATING SAME

FIELD OF THE INVENTION

The present invention relates to semiconductor devices, and more particularly to integrated circuit semiconductor devices.

BACKGROUND OF THE INVENTION

Fuse elements are widely used in semiconductor memory devices to provide nonvolatile designations of active modes therein. For example, as described in U.S. Pat. No. 5,469,388 entitled *Row Redundancy Circuit Suitable for High Density Semiconductor Memory Devices*, assigned to the assignee of the present application, fuse circuits can be programmed to, among other things, substitute a spare cell array word line for a defective word line in a normal cell array. A fuse circuit can also be programmed so that when a defective word line is addressed, the fuse circuit activates a word line in a spare cell array and also activates a redundancy signal line. Preferably, when a fuse circuit has been programmed to allow a spare word line to replace a defective word line in a normal cell array, the fuses in the fuse circuit are blown to provide nonvolatile detection of the address signal of the defective word line.

Typical methods of blowing fuses include (i) irradiation by a laser at a surface of an exposed integrated circuit chip, prior to packaging of the chip, and (ii) application of a high level current through a fuse element. However, because the former method is generally only capable of being used at the wafer or chip stage when the fuse element can be exposed to light, it is less advantageous than the current application method which can be used after final packaging of the integrated circuit chip by applying preselected signals to the pins of the packaged chip.

Referring now to FIG. 1, a prior art circuit for generating option changing signals which can be used, for example, to detect addresses of defective lines and select a redundant decoder of a memory circuit, will be described. As will be understood by those skilled in the art, the fuse circuits of FIG. 1 may be programmed in advance to recognize addresses of defective lines and select redundancy decoders by selectively disconnecting (i.e., "blowing") fuses therein and causing the generation of option changing signals based on the disconnected fuses. As described more fully below, the first internal option changing signal generator 300 of FIG. 1 can be programmed to generate a "high" (i.e., logic 1) first internal option changing signal by blowing a fuse 49 therein in response to predetermined first and second external input signals. Similarly, the second internal option changing signal generator 301 of FIG. 1 can also be programmed, in parallel with the first generator 300, to generate a "high" second internal option changing signal by blowing a fuse 49 therein in response to third and fourth external input signals. As described herein, the construction of Blocks 100 and 101 correspond to the circuit of FIG. 3A; the construction of Blocks 200 and 201 correspond to the circuit of FIG. 3B; and the construction of Blocks 300 and 301 correspond to the circuit of FIG. 3C. In the circuit of FIG. 3A, three inverters (2, 10 and 11), three NAND gates (3, 6 and 9) and four NOR gates (4, 5, 7 and 8) are provided, as illustrated. In the circuit of FIG. 3B, two NAND gates (20 and 28), eight inverters (21–27 and 29) and a resistor 30 and capacitor 31 are provided. Finally, in the circuit of FIG. 3C, two NMOSFETS (50 and 43), three inverters (44, 46–47), two capacitors (41 and 45), a fuse 49 and resistor 42 are provided, as illustrated.

In particular, programming of the first option changing signal generator 300 can be performed by applying a preselected nine-bit wide first external input signal (e.g., 000011100) to pins 1–9 of the first fuse signal generator 100 to generate a "high" (e.g., logic 1) output. This output is then provided in combination with a second external input signal to the input of a two-input NAND gate 20 of the second fuse signal generator 200. This generates a "high" second fuse signal at the output of the second fuse signal generator 200. The second fuse signal is then provided as an input to the gate electrode of an NMOS transistor 50 within an input block 40, as illustrated by FIG. 3C. The application of a "high" signal to the gate of the NMOS transistor causes the fuse 49 to blow in response to a high current level, supplied by the power supply (VDD). The occurrence of a blown fuse 49 causes the input to an inverter 44 to be pulled "low" and the generation of a "high" first internal option changing signal at the output of Block 300. Because the step of blowing the fuse 49 generally cannot be reversed, the first internal option changing signal can be used to provide a nonvolatile designation of an active mode of an integrated circuit, such as a memory circuit as described above. Similar programming steps can also be performed to generate a second internal option changing signal in response to third and fourth external input signals, simultaneously with the steps to generate the first internal option changing signal.

Unfortunately, the yield of integrated circuits embodying fuses, for providing nonvolatile designations of active modes therein, can be adversely affected by spurious programming signals and noise signals if these signals inadvertently cause a "high" level signal at the gate of the NMOS transistor 50, resulting in a blown fuse 49. Accordingly, these exists a need to more reliably protect against noise and spurious programming signals which might adversely cause a fuse to be inadvertently blown.

SUMMARY OF THE INVENTION

It is therefore an object of the present invention to provide integrated circuits with improved fuse-based mode selection capability, and methods of operating same.

It is another object of the present invention to provide integrated circuits having reduced susceptibility to noise and inadvertent mode designation signals, and methods of operating same.

These and other objects, features and advantages of the present invention are provided by an integrated circuit semiconductor device containing a first internal option changing signal generator with a fuse for storing a first logic state when the fuse is blown, in response to an externally generated predetermined first input signal, and for generating a first option changing signal based on the stored first logic state. To reduce the susceptibility to noise and inadvertent designation signals, a second internal option changing signal generator with a fuse for storing a second logic state when the fuse is blown is also provided and that fuse is blown in response a second externally generated predetermined input signal. However, rather than blowing the fuses of the first internal option changing signal generator and the second internal option changing signal generator by applying external input signals simultaneously, and thereby increasing the risk that noise or other spurious signals might inadvertently blow a series of fuses, the fuses of the present invention are blown sequentially by connecting the second internal option changing signal generator in series with the first internal option changing signal generator so that a second option changing signal cannot be generated unless the first option changing signal has already been generated first.

To further lessen the likelihood of inadvertently blowing a fuse, thereby causing a reduction in yield of an integrated circuit semiconductor device, the first internal option changing signal generator is also connected in series with a dummy option changing signal generator. This dummy option changing signal generator is not used to designate an active mode of an integrated circuit, such as a memory device, but is used solely to prevent the inadvertent generation of the first logic state caused by a blown fuse in the first internal option changing signal generator. Preferably, the first option changing signal and second option changing signal are provided to a functional circuit to designate an active mode. In particular, the option changing signals can be used to determine when a defective word line of a memory circuit is being addressed and to generate a redundancy signal response thereto.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 2:
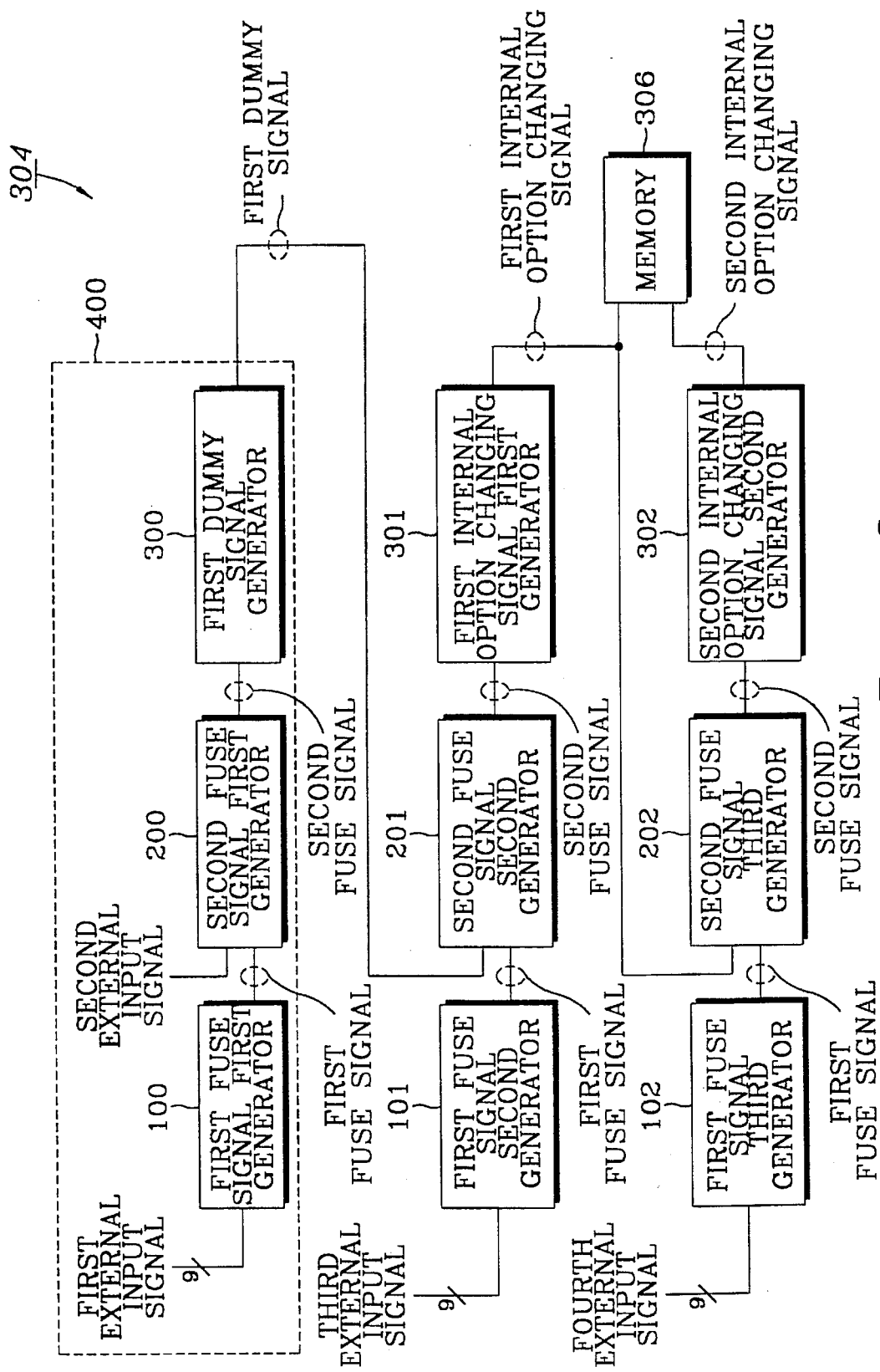
FIG. 2 illustrates a block diagram of a circuit for generating option changing signals according to an embodiment of the present invention.
Figure 3A:
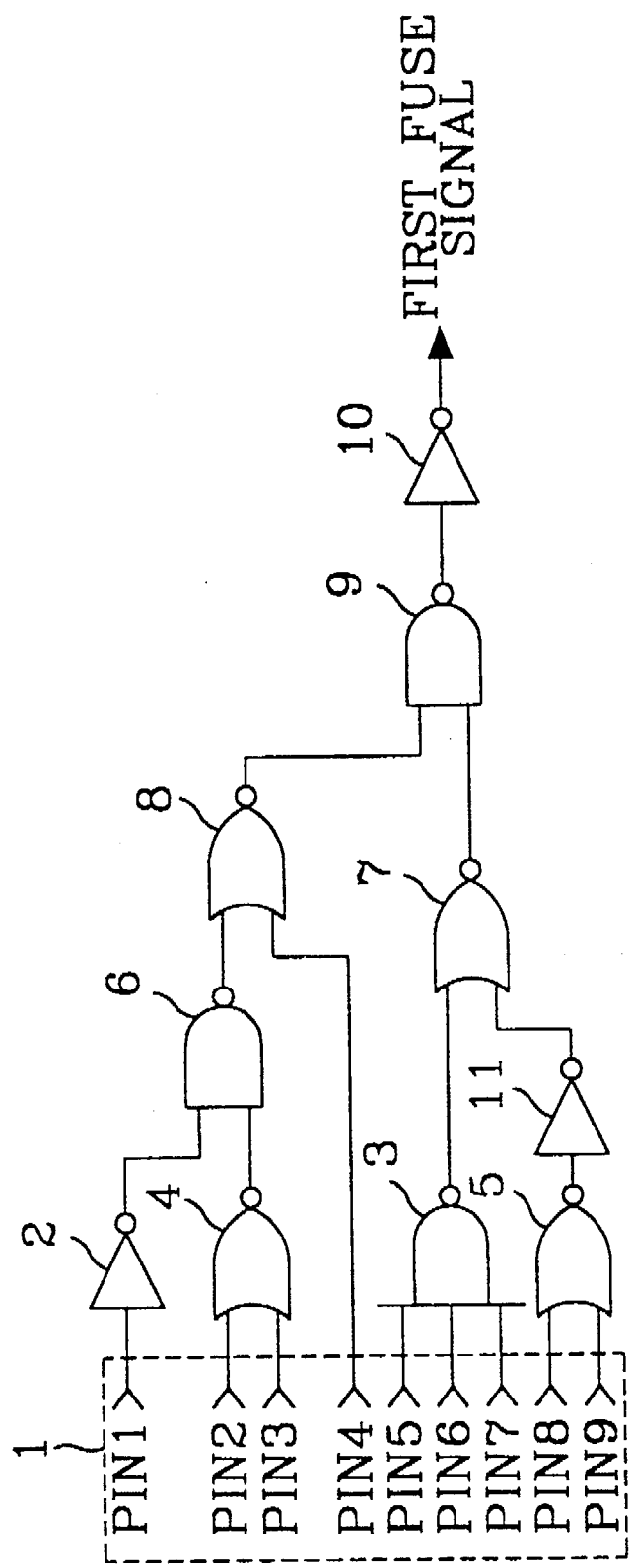
FIGS. 3A–3C are prior art electrical schematic circuit diagrams illustrating the electrical operations performed by the blocks of FIGS. 1 and 2.
Figure 3B:
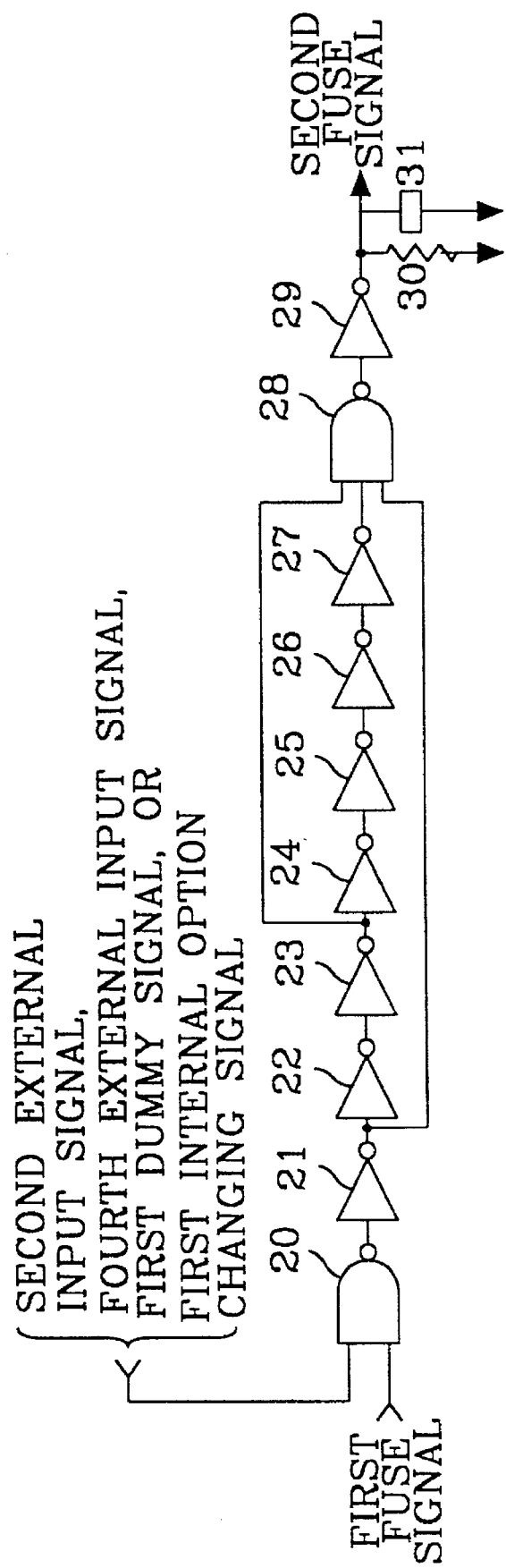
Figure 3C:
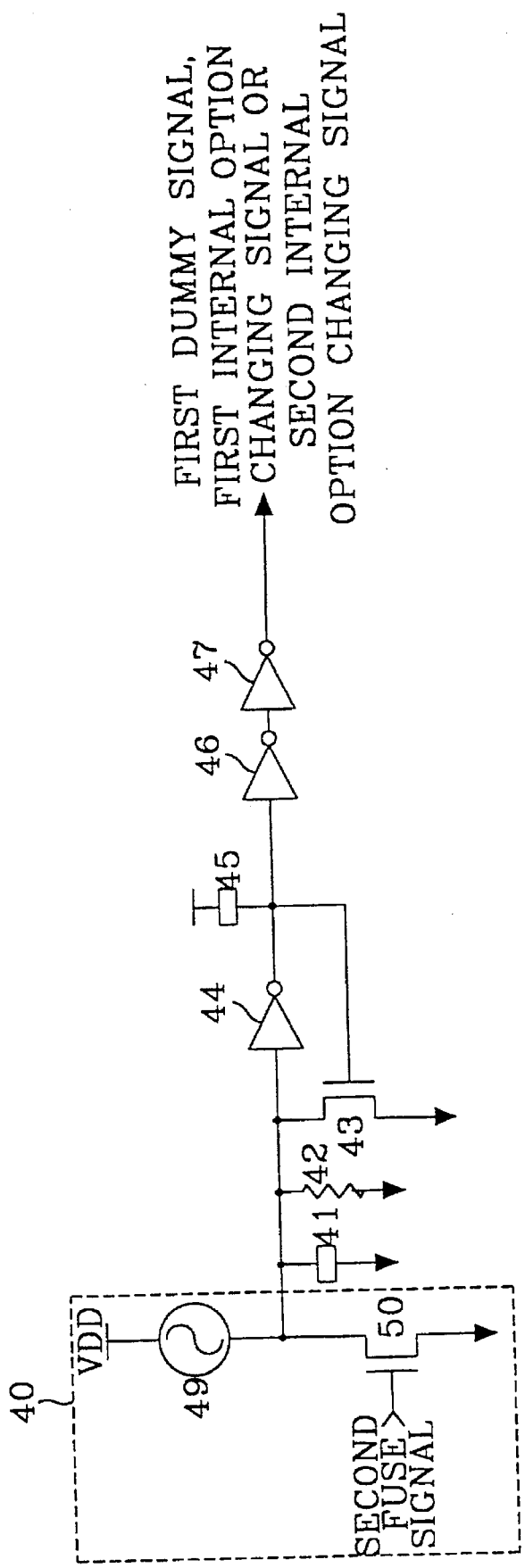

Referring now to FIGS. 2 and 3A–3C, a preferred embodiment of the present invention will be described. In particular, FIG. 2 illustrates a block diagram representation of a preferred option changing signal generator 304 for generating a plurality of option changing signals. As will be understood by those skilled in the art, these option changing signals may be provided to a functional integrated circuit 306 (e.g., memory device) to designate an active mode(s) therein. FIGS. 3A–3C are also electrical schematic circuit diagrams illustrating the electrical operations performed by the blocks of FIG. 2. Here, the electrical circuit schematic for performing the operations performed by Blocks 100–102 of FIG. 2 is illustrated at FIG. 3A; the electrical circuit schematic for performing the operations performed by Blocks 200–202 of FIG. 2 is illustrated at FIG. 3B; and the electrical circuit schematic for performing the operations performed by Blocks 300–302 of FIG. 2 is illustrated at FIG. 3C.

According to the preferred embodiment, the integrated circuit generator 304 preferably contains a first internal option changing signal generator 301 with a fuse 49 for storing a first logic state (i.e., logic 1) at an output inverter 47, when the fuse 49 is blown. As illustrated, the fuse 49 can be blown in response to an externally generated predetermined input signal, shown as a third external input signal. This signal, which may be multiple bits wide as illustrated by FIG. 3A, is provided from an external source to an input to the first fuse signal second generator 101, preferably during diagnostic testing or when the integrated circuit is being configured in an active mode(s). Once the fuse 49 in the generator 301 has been blown, a "high" first internal option changing signal, based on the stored first logic state, is provided at an output to designate an active mode in a functional circuit 306.

However, to lessen the likelihood of inadvertently blowing the fuse 49 in Block 301, thereby causing a reduction in yield of the functional circuit, the first option changing signal generator 301 is also responsive to the output of a dummy option changing signal generator 400. In fact, the fuse 49 in the first option changing signal generator 301 cannot be blown unless both inputs to the second fuse signal second generator 201 are "high". As illustrated, the dummy option changing signal generator 400 comprises a first fuse signal first generator 100, a second fuse signal first generator 200 and a first dummy signal generator 300 connected in series. The dummy signal generator 400 is responsive to first and second external input signals which must be preselected to cause the generation of a "high" output signal from the second fuse signal first generator 200. This "high" output from the second fuse signal first generator 200 is then used to blow the fuse 49 in the first dummy signal generator 300. This dummy option changing signal generator 400 is not used to designate an active mode of an integrated circuit, such as a memory device, but is used to prevent the inadvertent generation of the first logic state caused by a blown fuse 49 in the first internal option changing signal first generator 301. An exemplary memory device includes the memory device described in U.S. Pat. No. 5,469,388 entitled *Row Redundancy Circuit Suitable for High Density Semiconductor Memory Devices*, the disclosure of which is hereby incorporated herein by reference.

Figure 1:
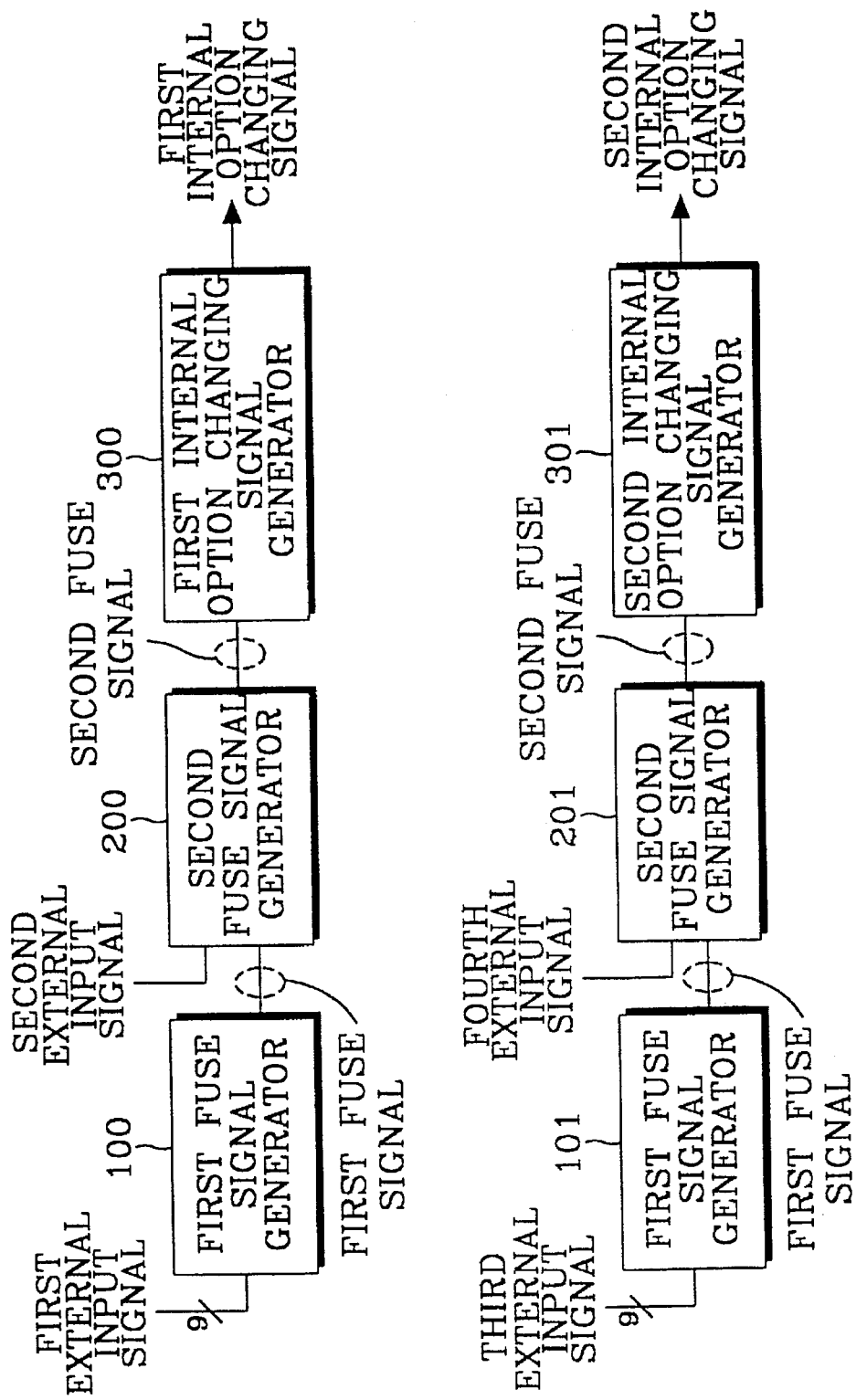
FIG. 1 illustrates a block diagram of a circuit for generating option changing signals according to the prior art.

This ability to suppress inadvertently blown fuses is preferably achieved by connecting the signal generators 300–302 in series so that the fuses therein can only be blown in a predetermined and controlled sequence, instead of in parallel in response to the simultaneous application of first, second, third and fourth input signals, as illustrated by the prior art device of FIG. 1. In other words, the fuse 49 of the first internal option changing signal first generator 301 will not be blown unless the output of the first dummy signal generator 300 is first made "high" in response to a blown fuse 49 therein and the output of the first fuse signal second generator 101 is also made "high".

Similarly, the fuse 49 of the second internal option changing signal second generator 302 will not be blown unless the output of the first internal option changing first generator 301 is "high" in response to a blown fuse 49 therein and the output of the first fuse signal third generator 102 is also "high" in response to a predetermined fourth external input signal. Thus, rather than blowing the fuses of the first internal option changing signal first generator 301 and the second internal option changing signal second generator 302 by applying external input signals simultaneously (and thereby increasing the risk that noise or other spurious signals might inadvertently blow a plurality of fuses simultaneously), the fuses of the present invention are blown sequentially and in a predetermined controlled manner which lessens the likelihood that spurious signals will inadvertently blow a fuse and cause a reduction in yield since a blown fuse is not repairable once an integrated circuit has been packaged. Accordingly, an active mode(s) of an integrated circuit may be more reliably established which means that in the case of a memory device, for example, a defective word line of a memory circuit may be more reliably detected and redundancy signals may be more reliably generated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit semiconductor device, comprising:

a first internal option changing signal first generator comprising a first fuse and means coupled to the first fuse for blowing the first fuse in response to a first input signal and for generating a first internal option changing signal at an output of said first internal option changing signal first generator when the first fuse is blown;

a second internal option changing signal second generator comprising a second fuse and means coupled to the second fuse for blowing the second fuse in response to a second input signal and for generating a second internal option changing signal at an output of said second internal option changing signal second generator when the second fuse is blown;

second fuse signal third generator means, responsive to the output of said first internal option changing signal first generator, for generating the second input signal;

a functional circuit responsive to the first and second internal option changing signals; and a dummy option changing signal generator comprising a first fuse signal first generator, responsive to a first external input signal, and a second fuse signal first generator, in series with the first fuse signal first generator, and responsive to an output of the first fuse signal first generator and a second external input signal and a dummy signal generator comprising a dummy fuse and means coupled to the dummy fuse for blowing the dummy fuse and for generating a first dummy signal at an output of said dummy option changing signal generator when the dummy fuse is blown; and wherein an output of the second fuse signal first generator is coupled to said means for blowing the dummy fuse in said dummy signal generator so that the dummy fuse can be blown in response to the output of the second fuse signal first generator being in a predetermined logic state.

2. The device of claim 1, further comprising a first fuse signal second generator, responsive to a third external input signal, and a second fuse signal second generator, in series with the first fuse signal second generator, and responsive to an output of the first fuse signal second generator and the first dummy signal; and wherein an output of the second fuse signal second generator is coupled to said means for blowing the first fuse so that the first fuse can be blown in response to the output of the second fuse signal second generator being in a predetermined logic state.

3. The device of claim 2, further comprising a first fuse signal third generator, responsive to a fourth external input signal, and a second fuse signal third generator, in series with the first fuse signal third generator, and responsive to an output of the first fuse signal third generator and the first internal option changing signal; and wherein an output of the second fuse signal third generator is coupled to said means for blowing the second fuse so that the second fuse can be blown in response to the output of the second fuse signal third generator being in a predetermined logic state.

4. An integrated circuit memory device, comprising:

a first internal option changing signal first generator comprising a first fuse and means coupled to the first fuse for blowing the first fuse in response to a first input signal and for generating a first internal option changing signal at an output of said first internal option changing signal first generator when the first fuse is blown;

a second internal option changing signal second generator comprising a second fuse and means coupled to the second fuse for blowing the second fuse in response to a second input signal and for generating a second internal option changing signal at an output of said second internal option changing signal second generator when the second fuse is blown;

second fuse signal third generator means, responsive to the output of said first internal option changing signal first generator, for generating the second input signal;

a memory circuit responsive to the first and second internal option changing signals; and a dummy option changing signal generator comprising a first fuse signal first generator, responsive to a first external input signal, and a second fuse signal first generator, in series with the first fuse signal first generator, and responsive to an output of the first fuse signal first generator and a second external input signal and a dummy signal generator comprising a dummy fuse and means coupled to the dummy fuse for blowing the dummy fuse and for generating a first dummy signal at an output of said dummy option changing signal generator when the dummy fuse is blown; and wherein an output of the second fuse signal first generator is coupled to said means for blowing the dummy fuse in said dummy signal generator so that the dummy fuse can be blown in response to the output of the second fuse signal first generator being in a predetermined logic state.

5. The memory device of claim 4, further comprising a first fuse signal second generator, responsive to a third external input signal, and a second fuse signal second generator, in series with the first fuse signal second generator, and responsive to an output of the first fuse signal second generator and the first dummy signal; and wherein an output of the second fuse signal second generator is coupled to said means for blowing the first fuse so that the first fuse can be blown in response to the output of the second fuse signal second generator being in a predetermined logic state.

6. The memory device of claim 5, further comprising a first fuse signal third generator, responsive to a fourth external input signal, and a second fuse signal third generator, in series with the first fuse signal third generator, and responsive to an output of the first fuse signal third generator and the first internal option changing signal; and wherein an output of the second fuse signal third generator is coupled to said means for blowing the second fuse so that the second fuse can be blown in response to the output of the second fuse signal third generator being in a predetermined logic state.

7. A method of generating a plurality of option changing signals for an integrated circuit memory device, comprising the steps of:

generating a first dummy option changing signal by blowing a dummy fuse if first and second external input signals have first and second predetermined values, respectively;

generating and providing a first internal option changing signal to the integrated circuit memory device by blowing a first fuse if a third external input signal has a third predetermined value and the dummy fuse has been blown; and generating and providing a second internal option changing signal to the integrated circuit memory device by blowing a second fuse if a fourth external input signal has a fourth predetermined value and the first fuse has been blown.

* * * * *